(12) United States Patent
Bolshukhin et al.

(10) Patent No.: US 8,410,422 B2
(45) Date of Patent: Apr. 2, 2013

(54) METHOD AND ARRANGEMENT FOR THE ADJUSTMENT OF CHARACTERISTICS OF A BEAM BUNDLE OF HIGH-ENERGY RADIATION EMITTED FROM A PLASMA

(75) Inventors: Denis Bolshukhin, Goettingen (DE); Alexander Christian Keller, Wendlingen/Neckar (DE); Max Christian Schuermann, Luebbecke (DE); Guido Schriever, Goettingen (DE); Imtiaz Ahmad, San Diego, CA (US); Juergen Kleinschmidt, Jena (DE)

(73) Assignee: XTREME technologies GmbH, Aachen (DE)

( * ) Notice: Subject to any disclaimer, the term of this patent is extended or adjusted under 35 U.S.C. 154(b) by 0 days.

(21) Appl. No.: 13/436,923

(22) Filed: Mar. 31, 2012

(65) Prior Publication Data

US 2012/0248327 A1   Oct. 4, 2012

(30) Foreign Application Priority Data

Apr. 1, 2011   (DE) .......................... 10 2011 016 058

(51) Int. Cl.
*G12B 13/00* (2006.01)
*G01D 18/00* (2006.01)
(52) U.S. Cl. .................. 250/252.1; 250/361 R; 250/362
(58) Field of Classification Search ............... 250/252.1, 250/340, 341.1, 341.4, 361 R, 362, 397
See application file for complete search history.

(56) References Cited

U.S. PATENT DOCUMENTS

| | | | |
|---|---|---|---|
| 6,829,261 B2 | 12/2004 | Kleinschmidt | |
| 6,865,212 B2 | 3/2005 | Kleinschmidt | |
| 6,882,704 B2 | 4/2005 | Schriever et al. | |
| 6,894,285 B2 | 5/2005 | Kleinschmidt et al. | |
| 6,894,298 B2 | 5/2005 | Ahmad et al. | |
| 6,914,920 B2 | 7/2005 | Kleinschmidt | |
| 7,599,470 B2 | 10/2009 | Kloepfel et al. | |
| 2006/0093210 A1 | 5/2006 | Tomura | |
| 2010/0140512 A1 | 6/2010 | Suganuma et al. | |
| 2010/0199173 A1 | 8/2010 | Morooka | |
| 2010/0288937 A1 | 11/2010 | Watanabe et al. | |

*Primary Examiner* — Mark R Gaworecki
(74) *Attorney, Agent, or Firm* — Patentbar International, P.C.

(57) ABSTRACT

The invention is related to the adjustment of characteristics of a beam bundle of high-energy radiation emitted from a plasma, particularly for applications in semiconductor lithography. For acquiring and adjusting characteristics of a beam bundle of high-energy radiation emitted from a plasma and focused by means of collector optics, an intensity distribution of the radiation is acquired over the cross section of a convergent beam bundle in a measuring plane perpendicular to the optical axis in front of an intermediate focus of the collector optics, and intensity values are recorded in defined sectors for a quantity of reception regions of a measuring device which are aligned with different radii concentric to the optical axis, and measured quantities and control variables are determined from a comparison of the intensity values of different sectors for aligning the collector optics.

17 Claims, 3 Drawing Sheets

METHOD AND ARRANGEMENT FOR THE ADJUSTMENT OF CHARACTERISTICS OF A BEAM BUNDLE OF HIGH-ENERGY RADIATION EMITTED FROM A PLASMA

RELATED APPLICATIONS

This application claims priority to German Patent Application No. DE 10 2011 016 058.2, filed Apr. 1, 2011, which is incorporated herein by reference in its entirety.

FIELD OF THE INVENTION

The invention is directed to a method and an arrangement for the adjustment of characteristics of a beam bundle of high-energy radiation emitted from a plasma, particularly for applications in semiconductor lithography.

BACKGROUND OF THE INVENTION

Radiation sources for semiconductor lithography usually contain collector optics for collecting and focusing the radiation divergently emitted by a narrowly circumscribed, but not point-shaped, source location into a concentrated beam bundle along an optical axis. The beam bundles may proceed from a discharge-produced plasma (DPP) or a laser-produced plasma (LPP). The beam bundle is usually focused on a defined aperture in an intermediate focus (IF) to provide it as radiation source location for a specific application (e.g., for a scanner for semiconductor lithography).

For this purpose, it is necessary to align the optical axis of the collector optics within the source module relative to the axis defined through the position of the source location and of the adjoining optical system of the application. These two axes must be brought into correspondence and pass through the center of the IF aperture. Otherwise, a portion of the beam bundle would be reflected at the IF aperture diaphragm of the radiation source and the transmitted beam bundle would therefore be cut off. At the same time, besides the total intensity, the homogeneity within the cross section of the beam bundle should also be maximized after the intermediate focus.

However, the difficulty in the required alignment of axes consists in that the installation location of a metrologic measurement module is severely limited and in that, owing to the fact that the application (e.g., a lithographic scanner) follows directly, there is no free space behind the intermediate focus without completely decoupling the radiation source module from the application or interfering with the beam path within the application. Both of these options are undesirable.

Radiation sources for generating soft X-ray radiation (EUV) are operated at low pressures of a few pascals (1 ... 30 Pa) and, within a vacuum chamber, a plasma generating module generates either a discharge-produced plasma (DPP) or a laser-produced plasma (LPP) and produces a concentrated radiation source location (i.e., a plasma that is spatially extensive but point-shaped in a first approximation). The radiation which is emitted isotropically by this source location is imaged by collector optics in an intermediate focus (IF) in the immediate vicinity of an exit aperture (IF aperture) of the radiation source or of the vacuum chamber used for this purpose. The IF aperture often constitutes the interface between the radiation source module (including collector-condenser optics) and a downstream optical system of the application.

The quality of the beam bundle supplied in the intermediate focus is crucial for the application downstream thereof; for this reason, an optimal adjustment and simple correction of the alignment of the radiation source location (plasma), collector-condenser optics (hereinafter abbreviated as collector optics), and IF aperture are of the utmost importance within a radiation source module. Adjusting means for aligning the collector optics are commonly provided in the radiation source module between the radiation source location and IF aperture, allowing the collector optics to move its six degrees of freedom.

The conditions for the alignment of the beam bundle are defined for two planes: the plane of the exit aperture of the source module (i.e., the aperture of the intermediate focus) and a far-field plane behind the intermediate focus. In addition to the correct alignment of the beam bundle relative to the optical axis of the application unit, these conditions also include the intensity at a desired wavelength and the uniform distribution thereof over the cross section of the beam bundle. Accordingly, checking and correction of the alignment of collector optics and source location (plasma) requires data that are supplied by a measuring device which allows the characteristics of the beam bundle for a far-field plane to be monitored dependably in a stable manner over the long term and which acquires these measurement data without interfering with the beam path of the application unit. In this regard, however, it is problematic that the characteristics of the beam bundle in front of the aperture differ from those behind the aperture because, for example, a portion of the radiation does not pass the aperture.

SUMMARY OF THE INVENTION

Therefore, it is the object of the invention to find a novel possibility for acquiring and adjusting characteristics of a beam bundle of high-energy radiation emitted from a plasma by which representative measurement values can be acquired before the exit from the radiation source module (intrafocally), i.e., before an intermediate focus, on the basis of which collector optics can be aligned in such a way that characteristics of the beam bundle are adjusted in a defined manner in the far field (extrafocally).

In a method for acquiring and adjusting characteristics of a beam bundle of high-energy radiation in which radiation emitted from a plasma is directed by means of collector optics as a convergent beam bundle along an optical axis into a focus and is provided as a symmetrical and homogeneous beam bundle along the optical axis in a far-field plane after an exit aperture associated with the focus, the above-stated object is met through the following steps:

an intensity distribution of the radiation is acquired over the cross section of the convergent beam bundle in a measuring plane perpendicular to the optical axis before the exit aperture, intensity values are recorded for a quantity of reception regions of a measuring device which are aligned with different radii concentric to the optical axis, the reception regions are assigned to a coordinate system which is set up in such a way that the coordinate origin thereof is pierced by the optical axis and sectors are defined by means of the coordinate axes for the measuring plane, the intensity values of two respective different reception regions which are selected in the measuring plane for different measuring positions with respect to the coordinate system are compared, measured quantities are generated based on a plurality of intensity value comparisons with respect to the coordinate system defined in the measuring plane, the measured quantities are converted into control variables for adjusting devices of the collector optics, and the collector optics are aligned based on the determined control variables.

In an advantageous manner, the measurements and comparisons of intensity values, the determination of measured quantities and control variables and the application thereof for aligning the collector optics are repeated until the measured quantities deviate from a target value by less than a selected specified tolerance so that the intensity distribution of the convergent beam bundle is aligned relative to the optical axis substantially symmetrically and homogeneously over the cross section.

It proves advisable to compare the intensity values acquired from the reception regions or groups of reception regions aligned concentric to the optical axis to one another in order to represent the intensity distribution with respect to the distance from the optical axis as a measured quantity.

Preferably, intensity values from sectors of reception regions aligned concentric to the optical axis, which sectors are equal in area and mirror-symmetrical to one another with respect to a respective coordinate axis of the coordinate system, are compared to one another and asymmetry factors are calculated therefrom as measured quantities on the basis of sums of the intensity values which are compared with respect to the respective coordinate axis.

After the first calculation of measured quantities has been carried out by comparing intensity values from mirror-symmetrically defined sectors of concentric reception regions, the coordinate system can advantageously be rotated around the optical axis by a determined angle and a second calculation of measured quantities can be carried out by comparing intensity values from mirror-symmetrically defined sectors in the axis positions which are changed in this way.

The selected coordinate system is advisably a Cartesian coordinate system whose first and second coordinate axes are selected orthogonal to one another in the measuring plane and whose third coordinate axis is always aligned along the optical axis.

The reception regions, as circular rings, are advantageously selected with respect to quantity and radius in such a way that radiation reflected only by certain structures of the collector optics can be acquired therein as separate intensity values.

Further, it proves advisable that the intensity values are acquired within circular ring-shaped reception regions in circular ring sectors, respectively, which are subdivided by the coordinate axes of a Cartesian coordinate system.

The measured quantities are advantageously calculated in the form of asymmetry factors based on sums of compared intensity values of mirror-symmetrically defined sectors of circular rings, and the alignment of the collector optics is concluded when these asymmetry factors are less than a predetermined tolerance value deviating from the target value zero with respect to each coordinate axis considered in the measuring plane.

Further, in an arrangement for acquiring and adjusting characteristics of a beam bundle of high-energy radiation in which radiation divergently emitted from a plasma is bundled in a focus within a radiation source unit along an optical axis by means of collector optics as convergent beam bundle and is coupled into an application unit following an exit aperture of the radiation source unit, which exit aperture is associated with the focus, wherein defined characteristics with respect to symmetry and homogeneity of the beam bundle are required after the focus along the optical axis in a far-field plane, the above-stated object is met in that a measuring plane for the acquisition of an intensity distribution of the radiation is arranged perpendicular to the optical axis in the convergent beam bundle within the radiation source unit in front of the exit aperture, in that a measuring device is provided for spatially resolved recording of the intensity distribution of the radiation, which measuring device has a quantity of reception regions arranged with different radii concentric to the optical axis and has at least one movable part by means of which the intensity distribution can be acquired temporarily within the measuring plane in the convergent beam bundle, in that a control unit is provided which is connected to the measuring device for spatially resolved recording of the intensity distribution and which has means for determining a coordinate system for the concentric arrangement of the reception regions in the measuring plane and means for generating measured quantities based on comparisons between intensity values acquired from the reception regions and for converting the measured quantities into control variables for aligning the collector optics, and in that adjusting devices which communicate with the control unit are arranged at the collector optics so that the collector optics can be manipulated in all degrees of freedom by means of control variables supplied by the control unit insofar as the respective measured quantities deviate from a respective target quantity in excess of a predetermined tolerance.

The collector optics advantageously have a plurality of shells which are arranged rotationally symmetrically around a longitudinal axis of the collector optics and to which separate reception regions of the measuring device are assigned, respectively, so that the respective reception region is adapted with respect to position and size for each instance of radiation reflected at a shell.

It proves particularly advisable that the measuring device has reception regions in the form of circular rings which are arranged in a concentrically continuous manner and which are divided by the coordinate axes of the coordinate system into at least four circular ring sectors for the spatially resolved acquisition of intensity values.

The measuring device for acquiring the intensity values advantageously has at least one screen which can be moved into the measuring plane and a rigidly attached camera for the spatially resolving capture of a two-dimensional image of the intensity distribution transmitted on the screen.

The screen is advantageously a luminescent screen by which high-energy radiation which is emitted by the radiation source and bundled by the collector optics is converted into visible light, and the camera is then constructed as a conventional camera which is sensitive to visible light.

In a first embodiment form, the measuring device advantageously has a camera which is oriented obliquely to the screen located in the measuring plane and is constructed with an objective lens/sensor adjustment according to the known Scheimpflug condition.

In a second constructional variant, the measuring device advisably has a deflecting mirror which is arranged downstream of the screen and which is movable together with the latter and which deflects the intensity distribution transmitted by the screen onto the camera.

A third embodiment of the measuring device has a camera which is arranged downstream of the screen and which is rigidly coupled with the latter so as to be swivelable together with it into the optical axis.

The underlying idea of the invention is based on the consideration that the characteristics of the (extrafocal) far field of the beam bundle supplied by the radiation source module for an application unit must be reliably determined from characteristics of a portion of the beam bundle before the exit aperture of the radiation source module, i.e., before the intermediate focus (intrafocally), in order to implement an adjustment and correction of the bundle characteristics of the radiation source within the radiation source unit and, accordingly, to avoid interference with the downstream application or to obviate external testing of the disassembled radiation source unit.

The invention solves this problem in that a measuring device is arranged intrafocally in a plane as close as possible to the intermediate focus, which plane is preferably orthogonal to the optical axis and allows a segmented acquisition of intensity values within the beam cross section so that, in addition to intensity measurements over the entire beam cross section, intensity values can also be acquired in individual regions, and intensity distributions and changes made to the latter when manipulating the collector alignment can be evaluated.

In this regard, the optical axis is defined as a straight line through a statistical center point (or reference position) of the radiation source location and through the center of the exit aperture of the radiation source module. The concept of "statistical center point of the radiation source location" takes into account that the emission of radiation from the plasma fluctuates from pulse to pulse (in DPP the same as in LPP) and therefore changes around a central point, i.e., the statistical center point, averaged over time. The point at which the optical axis pierces the measuring device is determined by means of mechanical references relative to the exit aperture of the radiation source module and the holder or guide of the measuring device is reproducibly adjusted in a corresponding manner.

The intensity values which are acquired in a segmented (spatially resolved) manner are recorded through suitable means in such a way that the degree of spatial resolution is adapted to the qualitative requirements of the alignment of the beam bundle. In this respect, it is advantageous when the measuring plane is enclosed by two coordinate axes of a Cartesian coordinate system whose origin lies on the point of penetration of the (ideal) optical axis through the measuring plane, and the optical axis is assigned to the third coordinate axis of the coordinate system. Circular rings which are defined in the measuring plane can be subdivided through the coordinate axes into suitable circular ring sectors for the segmented intensity values, the circular ring sectors preferably being selected in such a way that the intensity values acquired for them can be assigned to determined structures of the collector optics. It is also possible to use polar coordinates in the measuring plane.

Measured quantities are generated from the intensity values of the measuring device in that measurement values formed from circular ring sectors are compared to one another individually or in groups. The comparison is preferably carried out by means of a mathematical assignment rule which relates the acquired intensity values of defined circular rings or circular ring sectors to one another and, as a result, delivers measured quantities which are used for manipulating (aligning) the collector optics. In so doing, a deviation from a symmetrical distribution can be determined with respect to each axis of a selected coordinate system.

The alignment of the collector optics is concluded when the direction of the axis of symmetry of the beam bundle is adjusted optimally with respect to the direction of the (ideal) optical axis because the deviations of the intensity values compared by means of the assignment rule are less than a predetermined tolerance value (abort criterion).

By means of the invention, it is possible to acquire and adjust characteristics of a beam bundle of high-energy radiation emitted from a plasma in that representative measurement values are acquired before the exit from the radiation source module, i.e., before the intermediate focus (intrafocally), on the basis of which measurement values the collector optics can be aligned in such a way that characteristics of the beam bundle are adjusted in a defined manner in the far field (extrafocally).

BRIEF DESCRIPTION OF THE DRAWINGS

The invention will be described more fully in the following with reference to embodiment examples and drawings. The drawings show.

DETAILED DESCRIPTION OF THE PREFERRED EMBODIMENTS

Figure 1:
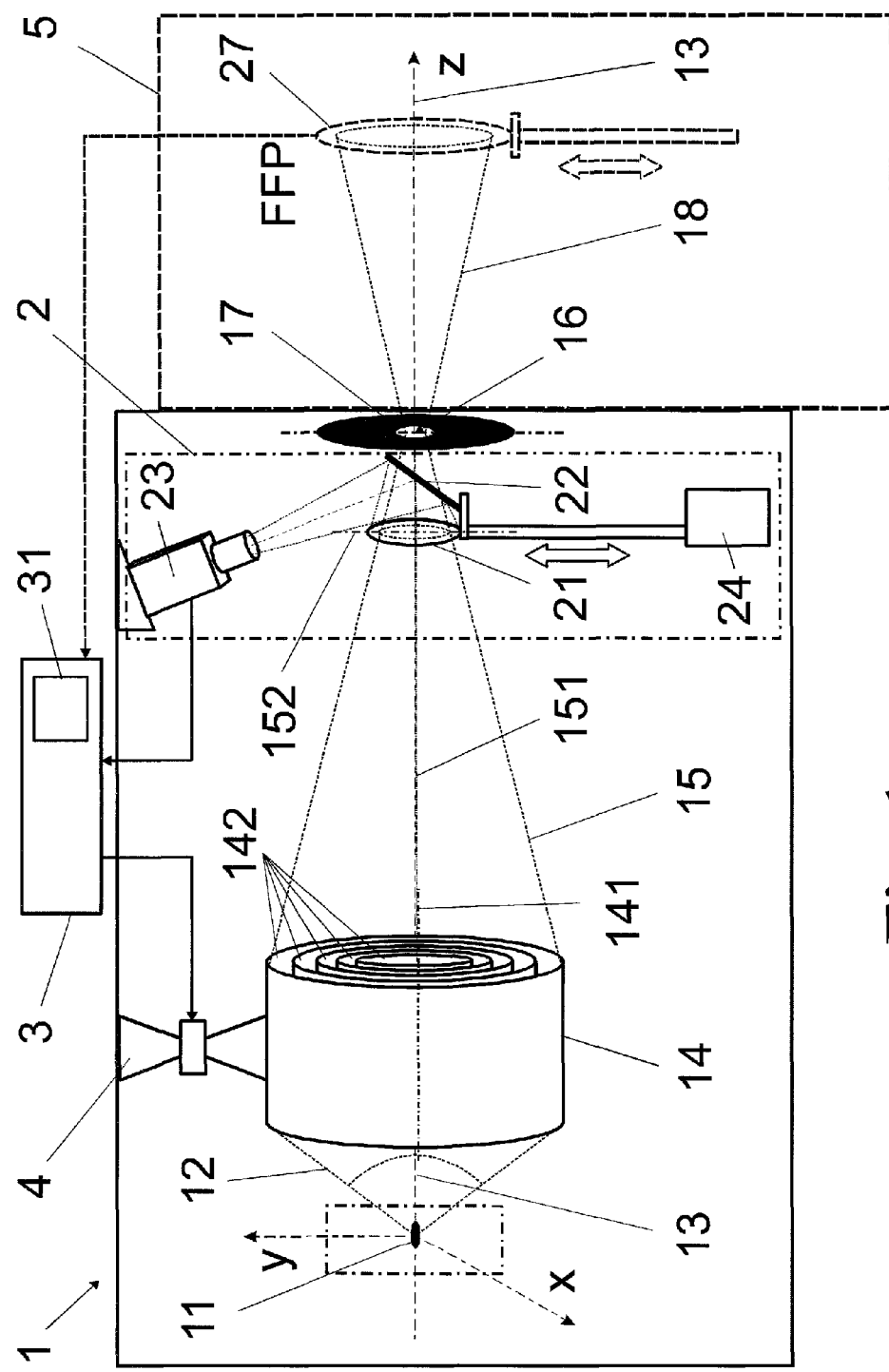
FIG. 1 an embodiment example of an arrangement according to the invention.

As can be seen from FIG. 1, the essential elements in the basic construction of an arrangement according to the invention comprise a radiation source unit 1 for supplying high-energy radiation having a radiation source 11 in the form of a hot dense plasma (GDP or LPP), a beam bundle 12 emitted by the radiation source 11, an optical axis 13 proceeding from the radiation source 11 in direction of an exit aperture 17 of the radiation source unit 1 for imaging a focus 16 as secondary source location, collector optics 14 having a longitudinal axis 141 for imaging the radiation source 11 in a focus 16 in the vicinity of the exit aperture 17, a measuring device 2 for spatially resolving measurement of characteristics in the cross section of the convergent beam bundle 15 coming from the collector optics 14, a control unit 3 for storing and evaluating the spatially resolving measurements and determining control variables for the alignment of the collector optics 14, adjusting devices 4 for aligning the collector optics 14, and an application device 5 which follows the exit aperture 17, the far-field plane being adjusted after the focus 16 in an optimal manner for the optical system of the application device 5 which consequently predetermines the (ideal) optical axis 13 of the radiation source unit 1.

The optical axis 13 extends from the statistical center point of the radiation source 11 to the center of the exit aperture 17 in which the focus 16 is imaged so as to function as defined secondary source location of the radiation source unit 1.

The radiation emitted by a radiation source 11 which is generated, e.g., from a gas discharge plasma (DPP) having a wavelength of 13.5 nm is collected by the collector optics 14 as divergently emitted beam bundle 12, bundled as convergent beam bundle 15 along the optical axis 13, and focused in the focus 16 which, as intermediate focus (IF) of the overall system, serves as the interface to an application device 5. This application device 5 is, for example, an EUV lithography scanner for semiconductor chip fabrication. The radiation source 11 is preferably a gas discharge plasma but can also be formed by a laser-generated plasma (LPP) or a combination thereof (so-called hybrid source).

When the radiation source unit 1 is ideally adjusted, optical axis 13, longitudinal axis 141 of the collector optics 14, and axis of symmetry 151 of the convergent beam bundle 15 coincide and result in a homogeneous symmetrical intensity distribution in the cross section of the convergent beam bundle 15. However, this is generally not the case when using multi-shell, nested collector optics 14 with grazing reflection.

According to the selected construction in FIG. 1, the collector optics 14 are Wolter optics formed of five nested shells 142 which can be controlled, i.e., mechanically displaced with respect to alignment, individually through separate adjusting devices 4. Each shell 142 is arranged in such a way that an annular partial bundle of different diameter, respectively, is collected, reflected and directed into the focus 16 by each shell 142 of the collector optics 14. In so doing, exactly one determined spatial section (circular ring 25, shown only in FIG. 2) of the measuring plane 152 in the cross section of the convergent beam bundle 15 can be assigned to each shell 142 of the collector optics 14, in which spatial section, exclusively, radiation is reflected by a respective shell 142 under consideration. The shells 142 can be controlled separately, and therefore also asymmetrically with respect to one another, by the adjusting devices 4.

In specific embodiments, the shells 142 can also be constructed as partial shells (e.g., half-shells or quarter-shells, not shown, which are divided coaxial to the longitudinal axis 141) which then have separate adjusting devices 4, respectively.

A measuring plane 152 which is oriented perpendicular to the optical axis 13 is defined in the beam path of the convergent beam bundle 15, and a measuring device 2 is arranged so that it can be swiveled into the measuring plane 152. For swiveling in or sliding in the measuring device 2, the latter is coupled with a drive 24.

The measuring device 2 comprises a screen 21 which is positioned in the measuring plane 152 and which converts the high-energy radiation emitted by the radiation source 11 into an attenuated secondary radiation, which allows the intensity in the cross section of the convergent beam bundle 15 to be detected by conventional matrix-shaped radiation receivers (e.g., CCD cameras or CMOS cameras).

Without limiting generality, it will be assumed in FIG. 1 that EUV radiation in the region of 13 nm is converted through the screen 21 into visible light (luminescent screen) so that a deflecting mirror 22 arranged behind the screen 21 deflects low-energy visible light (VIS radiation) to a camera 23 sensitive to visible light which is arranged outside the convergent beam bundle 15. In this example, the camera 23 is a CCD matrix camera with a resolution of at least 0.2 megapixels, preferably up to 5 megapixels.

Additional optical means can be provided in the beam path between the mirror 22 and the camera 23 through which a distortion of the intensity profile transmitted from the luminescent screen 21 to the camera 23 is compensated. However, the distortion can also be corrected subsequently in the electronically displayed image. Further, additional filters limiting the wavelength region (so-called purity filters) can be arranged in the beam bundle 15 in front of the screen 21.

In a modified embodiment of the invention, the measuring device 2 can also be constructed as a sensor array which can be swiveled directly into the convergent beam bundle 15 and which has an EUV spectral band filter (EUV purity filter) arranged in front of it and, alternatively, radiation-attenuating devices such as absorption filters, radiation modulators, scanning diaphragms (not shown) which scan the beam cross section point by point, or a luminescent or other type of radiation converting screen 21.

A Cartesian coordinate system 26 (only shown in FIG. 2) whose origin coincides with the penetration point of the optical axis 13 through the measuring plane 152 is assigned to the beam cross section of the beam bundle 15 recorded by the camera 23. Concentric circular rings 25 which are divided, respectively, into four circular ring sectors 251 of equal size by the orthogonal coordinate axes 261 and 262 (x axis and y axis) of a Cartesian coordinate system 26 are defined around the origin.

Figure 2:
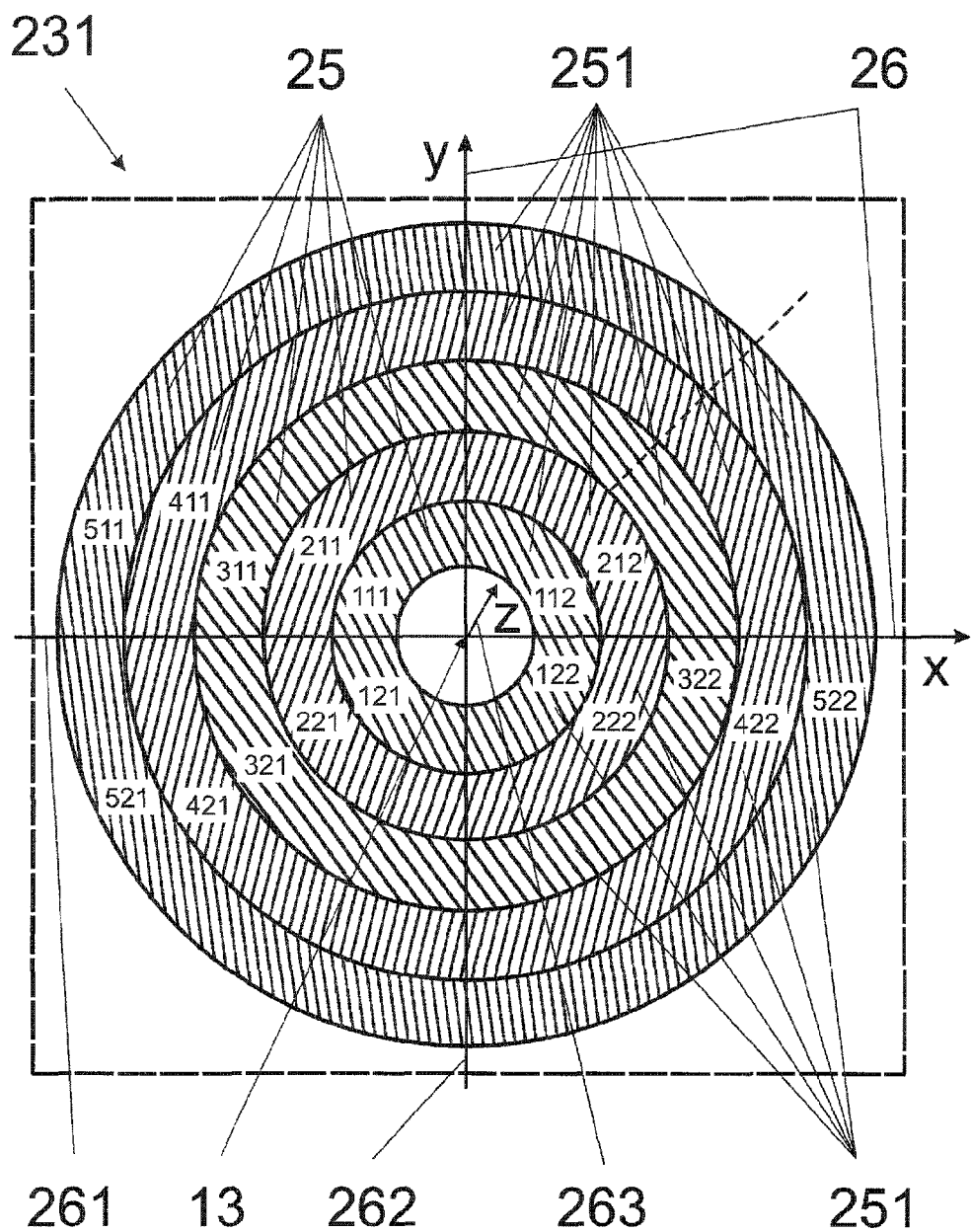
FIG. 2 a schematic diagram of the distribution of circular ring sectors over the cross section of a beam bundle.

This way of dividing up the measuring field in the cross section of the convergent beam bundle 15 is shown in FIG. 2 for the image plane 231 of the camera 23. The reception regions for the acquisition of segmented intensity values are selected in FIG. 2 as circular rings corresponding to the reflection zones of the shells 142 of the collector optics 14 (shown only in FIG. 1) and are subdivided by coordinate axes 261 and 262 into quadrants which divide the circular rings 25 into circular ring sectors 251.

Further, a dashed line is shown in the first quadrant which further subdivides the outer three circular ring sectors 251 so that—carried over to the rest of the quadrants—the sensor reception regions are segmented into eight circular ring sectors 251. This allows the intensity values to be evaluated more precisely with respect to inhomogeneities and asymmetries of the beam bundle 15.

However, a similarly sensitive evaluation can also be produced in that the division of the circular rings 25 into fourths is retained but, for purposes of evaluation, intensity values are recorded in two different orientations of the coordinate axes 261 and 262. To this end, the orientation of the coordinate system 26 is rotated by 45° around the piercing point of the optical axis 13 (which is retained unchanged as z axis of the coordinate system 26).

For this case, the coordinate system 26 is preferably defined in the acquired image of the camera 23 by computational means and is correspondingly switched in order to record a second set of intensity values.

However, in alternative embodiments, the coordinate system 26 which is defined in FIG. 2 as a software configuration of the sensor chip of the camera 23 can also be physically arranged on the luminescent screen 21 in the beam path between the screen 21 and the camera 23, e.g., on the deflecting mirror 22, or in the camera 23, e.g., on the camera objective.

The camera 23, the control thereof and the configuration of the control unit 3 are arranged in such a way that intensity values and the distribution thereof in the beam cross section are acquired in a spatially resolved manner and every acquired intensity value is uniquely assigned, respectively, to one of the circular ring sectors 251.

For calibrating the arrangement, a far-field sensor 27 communicating with the control unit 3 can be arranged, preferably once prior to the installation of the radiation source in an application (e.g., lithographic device), in the beam path of the beam bundle 18 propagating divergently behind the exit aperture 17. The far-field sensor 27 is used to acquire the characteristics of the extrafocal divergent beam bundle 18 in the far field beyond the focus 16 and aperture 17 and can be constructed as any suitably spatially resolving sensor unit which is segmented in the same manner as the intrafocal measuring device 2 and can be supplemented by beam-attenuating and/or beam-converting elements arranged upstream. The far-field sensor 27 can only be used provided that no application unit 5, such as a device for EUV lithography, for example, is arranged behind the aperture 17. It is used for calibrating the measured quantities and control variables which are obtained from the measurement values of the intrafocal measuring device 2 and for which corresponding calibrating factors are stored in the storage 31 of the control unit 3.

For acquiring and controlling intensity distributions according to the invention, a high-energy radiation is generated in a known manner, e.g., in the EUV range with a center wavelength of 13.5 nm, from an emitting plasma as radiation source 11. For this purpose, configurations described in U.S. Pat. No. 6,894,298 B2, U.S. Pat. No. 6,882,704 B2 or U.S. Pat. No. 7,599,470 B2 can be used. The relative position and the pulse-to-pulse stability of the plasma 11 are maintained constant by known controlling means and methods such as those known, for example, from U.S. Pat. No. 6,894,285 B2, U.S. Pat. No. 6,829,261 B2, U.S. Pat. No. 6,865,212 B2 and U.S. Pat. No. 6,914,920 B2.

The emitted beam bundle 12 is collected by means of collector optics 14 and is bundled in a focus 16 as a convergent beam bundle 15 along the defined (ideal) optical axis 13. After reaching a constant operating mode of the plasma generating device (not designated by reference number and indicated only schematically as a box in dash-dot lines), the measuring device 2 is inserted into the measuring plane 152 perpendicular to the optical axis 13 in such a way that the cross section of the convergent beam bundle 15 is imaged on at least a portion of the measuring means 2. When the cross section impinges on a luminescent screen 21, the imaging of the high-energy radiation of the convergent beam bundle 15 can be acquired in radiation of another wavelength and lower radiation energy and can be further processed.

The luminescent screen 21 is excited by the impinging high-energy radiation to emit visible light. This visible light is directed to a suitable sensor with respect to spectrum. In the embodiment example according to FIG. 1, a minor 22 and a camera 23 are provided for this purpose.

The image acquired by the camera 23 is digitized and contains, per picture element (pixel), information about the acquired intensity value and about the relative position of the pixel in the acquired image.

In the image generated by the camera 23, a Cartesian coordinate system 26 is defined according to FIG. 2 by known computational means in such a way that the origin thereof coincides with the point at which the optical axis 13 passes through the measuring plane 152 and the x-y plane enclosed by coordinate axes 261, 261 is projected on the measuring plane 152. The z coordinate axis 263 of the coordinate system 26 is assigned to the optical axis 13.

The correct adjustment of the coordinate origin is ensured through suitable auxiliary means such as marks, encoder positions, limit switches, etc., in case of an unintentional loss of adjustment of the measuring device, e.g., as a result of positioning movements or thermal loads. The measuring plane is arranged directly in front of the aperture, ideally (space considerations permitting) even in the IF itself. This position can be optimized on a case-to-case basis depending on the size and/or stability of the source location and on the properties of the collector optics such as magnification and aberrations.

Space conditions in the radiation source module permitting, the arrangement of an additional, second intrafocal measuring means in front of the exit aperture 17 is a meaningful option for detecting faulty adjustments of the actual (first) measuring device 2 and in order to obtain additional information on the angle of the convergent beam bundle 15 relative to the optical axis 13 and, therefore, increase the accuracy of the measuring and adjusting process as a whole.

In an alternative advantageous embodiment, the Cartesian coordinate system 26 is defined by a position of the coordinate origin which is established beforehand within the rigidly fixed camera 23.

In another alternative embodiment form, a luminescent screen 21 is merely inserted into the beam bundle 15, and a rigidly fixed camera 23 is directed obliquely to the screen 21 and, taking into account the Scheimpflug condition (with obliquely oriented sensor plane relative to the camera objective), the inclined position of the screen 21 (and therefore the perspective image distortion) is compensated and the light emitted by the screen 21 is recorded in a spatially resolved manner.

A quantity N of concentric circular rings 25 is defined around the origin of the coordinate system 26. The thickness of the circular rings 25, expressed as the difference between the outer radius and inner radius of every circular ring 25, is either identical for all circular rings 25 or adapted to the ring-shaped radiation components transmitted by the individual collector shells 142. The circular rings 25 adjoin one another directly in radial direction. However, they can also have gaps or, if measured sequentially, also overlaps.

The circular rings 25 are divided at least by divisions extending along the coordinate axes 261 and 262 and accordingly form at least four circular ring sectors 251 per circular ring 25 which have identical sector orientations over all of the circular rings 25. It is possible to further subdivide into circular ring segments 251 of equal size, preferably eight or sixteen, so that the divisions along the coordinate axes 261 and 262 are retained. In so doing, inner circular rings 25 can have fewer divisions than outer circular rings 25 in order to achieve a matching of the surface area contained by the circular ring sectors 251. In FIG. 2, an arrangement of this kind is indicated in the upper right-hand quadrant in which the outer three circular rings 25 per quadrant are subdivided again (⅛ of the circular ring 25) and the inner circular rings are formed as ¼ circular ring sectors 251. By subdividing the circular rings 25 multiple times per quadrant, fourfold divisions, i.e., ¹⁄₁₆ circular ring sectors (not shown), at least in the outer circular rings 25 can also be useful for detecting asymmetries or unequal intensity curves in the edge area of the convergent beam bundle 15.

This construction or interconnection of sensor elements in the image plane 231 of the camera 23 as was described above for the intrafocal measuring device 2 in the convergent beam bundle 15 can also be used in an analogous manner in the extrafocal divergent beam bundle 18 for a far-field sensor 27 which is applied at least for a first, or standard, calibration of the radiation source unit 1.

Each circular ring sector 251 is assigned the intensity values acquired by it. The respective assigned intensity values are summed over the circular ring sector 251 in question and are stored as partial intensities $I_{ijk}$ of the respective circular ring sector 251. The partial intensities $I_{ijk}$ for circular ring sectors 251 are explicitly identified with respect to their position relative to the coordinate axes 261, 262 (x coordinate axis and y coordinate axis) by the designation $I_{ijk}$, where index i is a running index from 1 to quantity N of the existing circular rings 25 and increases radially from the inner side to the outer side. Index j indicates the vertical position of the respective circular ring sector 251 relative to the horizontally extending coordinate axis 261 (x coordinate axis), where j can take on the value 1 (position above the coordinate axis 261) or 2 (position below the coordinate axis 261). Analogous to index j, index k indicates the horizontal position of the circular ring sector 251 relative to the vertically extending coordinate axis 262 (y coordinate axis), where 1=left-hand circular ring sectors and 2=right-hand circular ring sectors 251). In this example (with four quadrant-oriented circular ring sectors), $I_{312}$ designates the partial intensity of an upper right-hand circular ring sector 251 (in the first quadrant of coordinate system 26) of a third circular ring 25.

Naturally, the indices can also be modified in a corresponding manner and used with other numerical values, particularly when the circular rings are divided into eight or even sixteen sectors.

The total intensity $I_{total}$ acquired by the measuring device 2 overall can be calculated as the sum of all partial intensities $I_{ijk}$ by the following general formula $$I_{total} = \sum_{i=1}^{N} \sum_{j=1}^{2} \sum_{k=1}^{2} I_{ijk}. \quad (1)$$

To determine and evaluate asymmetric intensity distributions with respect to one of the coordinate axes 261, 262, the partial intensities $I_{ijk}$ of the circular ring sectors 251 located on one side of each coordinate axis 261, 262 are compared with the partial intensities $I_{ijk}$ of the circular ring sectors 251 located on the other side (i.e., in the mirror-inverted position) of the coordinate axis 261, 262. Further, partial intensities $I_{ijk}$ of the circular ring sectors 251 which are centrally symmetric to coordinate axis 263 (z axis) can also be compared to one another. Further, every asymmetry index calculated in this way is scaled to the total intensity $I_{total}$ acquired in total.

With respect to the x coordinate axis 261, the asymmetry index ASYx is defined as follows:

$$ASY_x = \frac{\sum_{i=1}^{N} \sum_{j=1}^{2} a_i * (I_{ij1} - I_{ij2})}{I_{total}}, \quad (2)$$

where $a_i=1$ or $-1$ depending on the type of minor combinations of each region of the collector optics 14.

Correspondingly, the following equation applies for the y coordinate axis:

$$ASY_y = \frac{\sum_{i=1}^{N} \sum_{k=1}^{2} b_i * (I_{i1k} - I_{i2k})}{I_{total}}, \quad (3)$$

where $b_i=1$ or $-1$ depending on the type of mirror combinations of each region of the collector optics 14.

An asymmetry of the intensity values around the z coordinate axis 263 can take place in such a way that the partial intensities $I_{ijk}$ of the (inner) circular rings 14 lying near the z coordinate axis 263 are compared with the partial intensities $I_{ijk}$ of the (outer) circular rings 14 remote of the z coordinate axis 263. The following formula is used for this purpose:

$$ASY_Z = \frac{\sum_{i=1}^{N/2} \sum_{j=1}^{2} \sum_{k=1}^{2} c_i * I_{ijk} - \sum_{i>N/2}^{N} \sum_{j=1}^{2} \sum_{k=1}^{2} c_i * I_{ijk}}{I_{total}}, \quad (4)$$

where $c_i=1$ or $-1$ depending on the type of minor combinations of each region of the collector optics 14.

If N is an even number, e.g., N=4, the partial intensities $I_{ijk}$ of the first and second circular ring 25—counted from the z coordinate axis 263—are compared with the partial intensities $I_{ijk}$ of the third and fourth circular ring 25.

If there are no asymmetries in the distribution of the acquired intensity values with respect to the respective coordinate axes 261 and 262, the asymmetry indices ideally have a value of zero. In practice, a tolerance value (threshold value) deviating from zero is allowed until no corrections of the collector optics 14 are initiated when this tolerance value is reached. In case corrective adjustments have already been carried out because of excessive deviations, readjustment is aborted when the tolerance value is reached (so-called abort criterion).

Formulas (1) to (4) indicated above can also be formulated differently. Further, they can contain correction functions which can take into account cases in which the partial intensity $I_{ijk}$ of a circular ring sector 251 lying farther away from the origin of the Cartesian coordinate system 26 is composed of more individual values than the partial intensity $I_{ijk}$ of a circular ring sector 251 lying closer to the coordinate origin.

Figure 3:
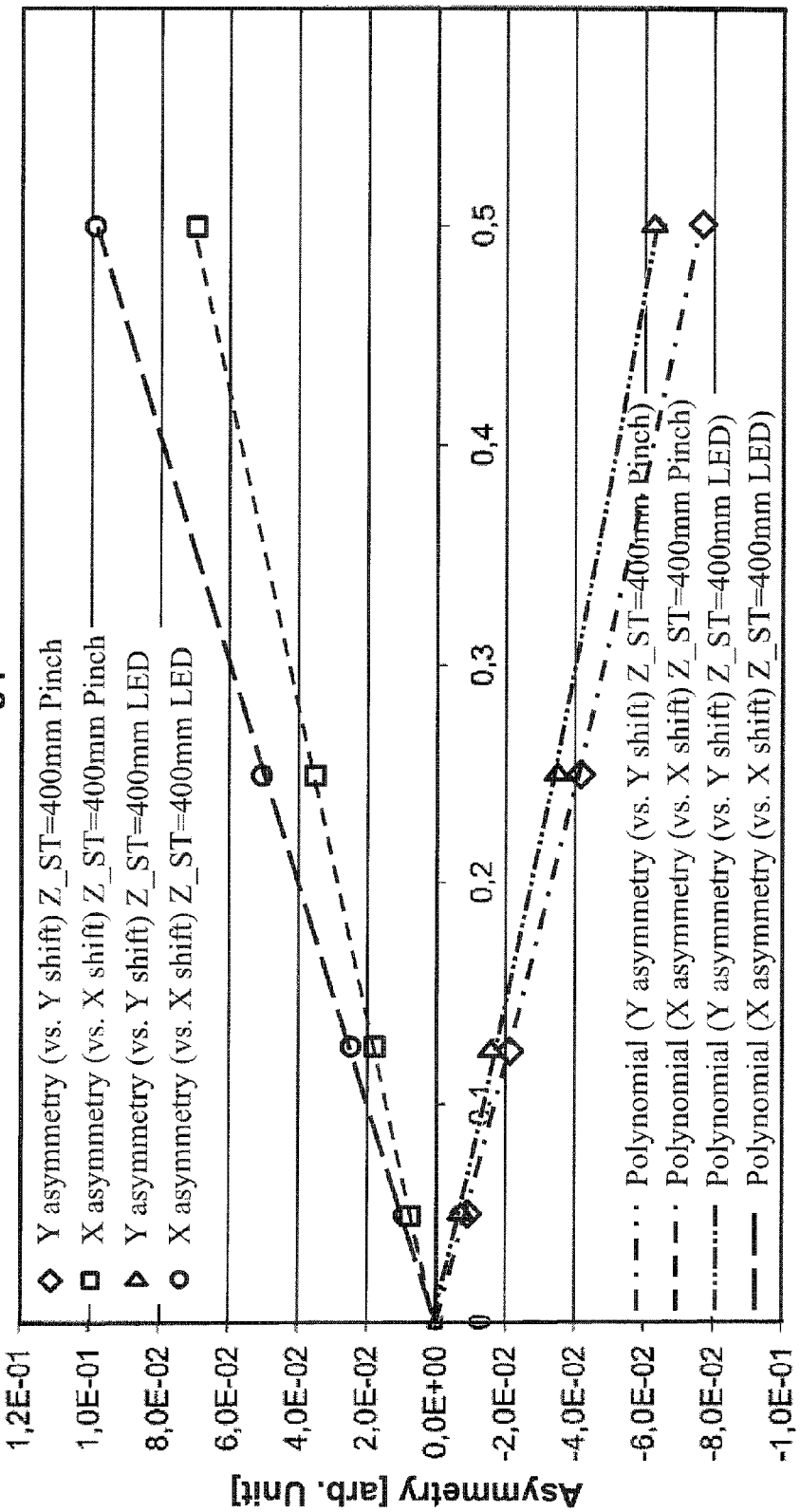
FIG. 3 an illustration of the relative asymmetry factors determined from circular ring sectors for determining control variables for the manipulation of the shells of the collector optics.

FIG. 3 shows the results of asymmetry factors $ASY_X$ and $ASX_Y$ over the deviations X and Y, respectively, of radiation source 11 from the position of the (ideal) optical axis 13. The dashed lines are the ASYx(dX) dependencies and the dash-dot lines correspond to the $ASX_Y(dY)$ dependencies. The dependencies for radiation source 11 with 13.5 nm emission wavelength (generated, e.g., by a Z-pinch plasma) are represented by closely arranged line patterns, while the dependencies for a radiation source with 670 nm (LED radiation source) have widely stretched line patterns (of the same type).

Prior to actual application of the method in an installation, the mathematical relationship between the asymmetry indices ASYx and ASYy determined as measured quantities and the deviation of the radiation source 11 from the optical axis 13 is determined based on empirical analyses and stored as an assignment rule. The above-mentioned extrafocal arrangement of a far-field sensor 27 can be used for this purpose.

Radiation source 11 and collector optics 14 are aligned with respect to one another in such a way that the characteristics of the divergent beam bundle 16 which are acquired by the far-field sensor 27 correspond in the extrafocal region to the desired characteristics. In so doing, defined deviations between reference state and actual state are allowed.

After a controlled displacement of the radiation source 11 by a certain amount and in a certain direction away from the optical axis 13, the change in the measured quantities caused by the displacement is determined. In order to compensate for these changes, the collector optics 14 are controlled by means of the adjusting devices 4. The control variables needed for compensating for a particular displacement are determined and stored. Through the application of well-known mathematical procedures such as linear or nonlinear regression, possibly accompanied by calculation of the associated confidence regions, an assignment rule between measured quantities and control variables is derived from the relationship of the measured quantities and the control variables required for compensation of the displacement indicated by the measured quantities and is stored.

Asymmetry index $ASY_z$ can also enter into the assignment rule. The ASY index Z is controlled for achieving the reference values of the beam diameter (inside and outside) and the optics transmission. For this purpose, there is a correlation between optics transmission and the position in Z.

The assignment rule must be determined anew in each instance and stored for different configurations of the arrangement and of the desired characteristics of the beam bundle 18 in the extrafocal region so that the appropriate corrections for readjusting the collector optics 14 can be carried out with exclusive measurements of the measuring device 2 in the intrafocal region of the convergent beam bundle 15.

During the operation of the radiation source unit 1, the correct alignment of the extrafocal beam bundle 18 along the optical axis 13 can be monitored and corrected if necessary with the proposed method. Over the duration of measurements by the measuring device 2, there is no radiation, or no usable radiation, available after the exit aperture 17, i.e., the monitoring measurements at the convergent beam bundle 15 for correcting the beam bundle 18 are carried out exclusively during intervals between exposures of the application unit 5.

For purposes of measuring, the measuring device 2 is inserted into or swiveled into the measuring plane 152 by means of the drive 24 and the intensity distribution is acquired (intrafocally) within the cross section of the convergent beam bundle 15. After assignment of the individual intensity values (partial intensities $I_{ijk}$) to the circular ring sectors 251, the asymmetry indices ASY are calculated and stored in a storage 31 of the control unit 3.

The measured quantities which have been determined and stored are translated into control variables using the assignment rule which has likewise been stored, and the adjusting devices 4 of the collector optics 14 are correspondingly controlled by the control unit 3.

After adjustment (readjustment or positioning) of the adjusting devices 4 has been carried out, the measurement values (partial intensities $I_{ijk}$) for the circular ring sectors 251 and the asymmetry index ASY are again determined and it is ascertained whether or not they deviate from zero by more than an allowed tolerance value. If the allowed tolerance is complied with, the measuring and correcting process is terminated. If the tolerance value is exceeded, the adjusting devices 4 of the collector optics 14 are adjusted using the last determined measured quantities (asymmetry index ASY).

It is possible to repeat the measurements after correction of the collector optics 14 has been completed, but in so doing the coordinate axes 261, 262 to be defined are rotated by a determined angle, e.g., 45°, around the optical axis 13 (which is retained as z coordinate axis 263). In this way, it is possible to find deviations from desired intensity distributions which were formed symmetric to the coordinate axes 261, 262 in a first position of the latter and which therefore complied with the tolerance values of asymmetry indices; however, these tolerance values are no longer kept with respect to a rotated coordinate system. This may be the case, for example, with an oval cross section of the convergent beam bundle 15.

However, the same measurement result and correction result can also be achieved when the position of the coordinate axes 261, 262 remains unchanged when the circular rings 25 are subdivided into eight or more circular ring sectors 251 so that comparisons between smaller sections in the cross section of the convergent beam bundle 15 yield a greater quantity of measurement values of higher spatial resolution.

By means of the proposed method and associated arrangement, it is possible to monitor the actual characteristics of a bundle of high-energy radiation generated from a plasma 11 through intrafocal measurements within the radiation source unit 1 and, if necessary, to correct them without having to separate the radiation source unit 1 from the complex arrangement of additional technical components of an application unit 5.

By means of the proposed solution, it is ensured that a high-energy radiation emitted from a plasma 11 is supplied in a very efficient and qualitatively consistent manner in an extrafocal beam bundle 18 with defined characteristics.

The methods and arrangements according to the invention can be used in an analogous manner in all fields in which high-energy radiation with defined beam characteristics and consistent quality must be provided such as, for example, for EUV lithography, laser welding and laser cutting, or the like.

| Reference Numerals | |
| --- | --- |
| 1 | radiation source unit |
| 11 | radiation source (plasma) |
| 12 | emitted beam bundle |
| 13 | optical axis |
| 14 | collector optics |
| 141 | longitudinal axis |
| 142 | shells |
| 15 | convergent beam bundle (intrafocal) |
| 151 | axis of symmetry (of the convergent beam bundle) |
| 152 | measuring plane |
| 16 | focus |
| 17 | exit aperture |
| 18 | divergent bundle (extrafocal) |
| 2 | measuring device |
| 21 | screen |
| 22 | mirror |
| 23 | camera |
| 24 | drive |
| 25 | circular ring (receiver region) |
| 251 | (circular ring) sector |
| 26 | coordinate system (Cartesian) |
| 261-263 | coordinate axis |
| 27 | far-field sensor |
| 3 | control unit |
| 31 | storage |
| 4 | adjusting devices |
| 5 | application unit |

What is claimed is:

1. A method for acquiring and adjusting characteristics of a high-energy beam bundle, comprising:

forming the beam bundle by a collector optics for directing a convergent beam bundle along an optical axis into a focus and providing a symmetrical and homogeneous beam bundle along the optical axis in a far-field plane after the focus;

defining an exit aperture associated with the focus which restricts an area for the acquisition of characteristics of the beam bundle to a section of the beam bundle before the exit aperture;

acquiring an intensity distribution of the radiation over a cross section of the convergent beam bundle in a measuring plane perpendicular to the optical axis before the exit aperture;

recording intensity values for a plurality of reception regions of a measuring device, wherein the reception regions are aligned with different radii concentric to the optical axis;

assigning the reception regions to a coordinate system having its coordinate origin disposed along the optical axis and defining a plurality of sectors in the measuring plane by coordinate axes of the coordinate system;

comparing the intensity values of two respective different reception regions selected in the measuring plane for different measuring positions with respect to the coordinate system;

generating measured quantities based on a plurality of intensity value comparisons with respect to the coordinate system defined in the measuring plane;

converting the measured quantities into control variables for adjusting devices of collector optics; and aligning the collector optics based on the determined control variables.

2. The method according to claim 1, further comprising repeating the steps of recording and comparing the intensity values for assigned different reception regions, generating measured quantities and converting the measured quantities into control variables, and aligning the collector optics until the measured quantities deviate from a target value by less than a selected specified tolerance, so that the intensity distribution of the convergent beam bundle is aligned relative to the optical axis substantially symmetrically and homogeneously over the cross section.

3. The method according to claim 1, further comprising comparing the intensity values acquired from the reception regions or groups of reception regions aligned concentrically with the optical axis in order to represent the intensity distribution with respect to the distance from the optical axis as a measured quantity.

4. The method according to claim 3, comprising selecting reception regions in form of a quantity of circular rings with non-overlapping radii o in such a way that radiation parts reflected by partial structures of the collector optics are each acquired in separate reception regions as separate intensity values.

5. The method according to claim 1, comprising comparing respective intensity values from the sectors of the reception regions aligned concentrically with the optical axis, the sectors being equal in area and mirror-symmetrical to one another with respect to a respective coordinate axis of the coordinate system, and calculating asymmetry factors from the respective intensity values as measured quantities on the basis of sums of the intensity values which are compared with respect to the respective coordinate axis.

6. The method according to claim 5, comprising two comparing steps, wherein
carrying out a first calculation of measured quantities by comparing the intensity values from the mirror-symmetrically defined sectors of the concentric reception regions,
rotating the coordinate system around the optical axis by a determined angle or at least one sector of the reception regions; and
carrying out a second calculation of measured quantities by comparing the intensity values from the mirror-symmetrically defined sectors in the axis positions of the changed coordinate system after rotation.

7. The method according to claim 1, wherein the coordinate system is a Cartesian coordinate system having first and second coordinate axes being orthogonal to one another in the measuring plane and having its third coordinate axis aligned along the optical axis.

8. The method according to claim 1, comprising acquiring the intensity values in the reception regions formed as circular rings in circular ring sectors, respectively, which are subdivided by coordinate axes of a Cartesian coordinate system.

9. The method according to claim 8, comprising calculating the measured quantities in the form of asymmetry factors based on sums of compared intensity values of mirror-symmetrically defined sectors of the circular rings, and concluding the alignment of the collector optics when the asymmetry factors are less than a predetermined tolerance value deviating from the target value zero with respect to each coordinate axis considered in the measuring plane.

10. An arrangement for acquiring and adjusting characteristics of a beam bundle of high-energy radiation, comprising:

a radiation source unit and an application unit into which a beam bundle couples via an exit aperture of the radiation source unit;
a collector optics arranged within the radiation source unit for collecting radiation and directing a convergent radiation beam bundle along an optical axis into a focus associated with the exit aperture for providing a symmetrical and homogeneous beam bundle along the optical axis in a far-field plane after the focus;
a measuring plane for acquiring an intensity distribution of the radiation disposed perpendicularly to an optical axis in the convergent beam bundle within the radiation source unit in front of the exit aperture;
a measuring device for spatially resolved recording of the intensity distribution of the radiation, the measuring device having a plurality of reception regions having different radii being concentric to the optical axis and having at least one movable part for acquiring the intensity distribution temporarily within the measuring plane in the convergent beam bundle;
a control unit coupled to the measuring device for spatially resolved recording of the intensity distribution, the control unit having means for defining a coordinate system for concentrically arranging the reception regions in the measuring plane and means for generating measured quantities based on comparisons between the intensity values acquired from the reception regions and for converting the measured quantities into control variables for aligning the collector optics; and
adjusting devices coupled to the control unit and arranged at the collector optics so that the collector optics can be manipulated in all degrees of freedom by means of the control variables supplied by the control unit, wherein the respective measured quantities deviate from a target quantity in excess of a predetermined tolerance.

11. The arrangement according to claim 10, wherein the collector optics comprises a plurality of shells rotationally symmetrically disposed around a longitudinal axis of the collector optics, the plurality of shells corresponding to separate reception regions of the measuring device, respectively, so that a respective reception region is adapted with respect to position and size for each instance of radiation reflected at a shell.

12. The arrangement according to claim 10, wherein the measuring device has the reception regions in the form of concentric circular rings disposed un a continuous manner, the rings being subdivided by the coordinate axes of the coordinate system into at least four circular ring sectors for acquiring the intensity values.

13. The arrangement according to claim 10, wherein the measuring device for acquiring the intensity values has at least one screen which can be moved into the measuring plane, and a camera for spatially resolving capturing of a two-dimensional image of the intensity distribution transmitted onto a screen.

14. The arrangement according to claim 13, wherein the screen is a luminescent screen for converting high-energy radiation emitted by the radiation source and bundled by the collector optics into visible light, and wherein the camera is a conventional camera sensitive to visible light.

15. The arrangement according to claim 14, wherein the measuring device has a camera oriented obliquely to the screen in the measuring plane, the camera comprising an objective lens/sensor adjustment in accordance with a Scheimpflug condition.

16. The arrangement according to claim 14, wherein the measuring device has a deflecting mirror disposed downstream from the screen, the mirror being movable together with the screen, the mirror serving to deflect the intensity distribution transmitted by the screen onto the camera.

17. The arrangement according to claim 14, wherein the measuring device has a camera disposed downstream from the screen in the optical axis, the camera being rigidly coupled to the screen so as to be moveable together with it.

* * * * *